United States Patent
Yi et al.

(10) Patent No.: US 6,822,274 B2
(45) Date of Patent: Nov. 23, 2004

(54) HETEROJUNCTION SEMICONDUCTOR DEVICE HAVING AN INTERMEDIATE LAYER FOR PROVIDING AN IMPROVED JUNCTION

(75) Inventors: Sung Soo Yi, Palo Alto, CA (US); Nicolas J. Moll, Woodside, CA (US); Dave Bour, Cupertino, CA (US); Hans G. Rohdin, Los Altos, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/358,369

(22) Filed: Feb. 3, 2003

(65) Prior Publication Data

US 2004/0149994 A1 Aug. 5, 2004

(51) Int. Cl.$^7$ .............................................. H01L 29/06
(52) U.S. Cl. ........................ 257/189; 257/183; 257/187
(58) Field of Search .............................. 257/85, 94, 96, 257/183, 187, 189–191, 197–198

(56) References Cited

U.S. PATENT DOCUMENTS

2002/0117657 A1 * 8/2002 Moll et al. ..................... 257/12

OTHER PUBLICATIONS

R. Driad, et al.; "InAlAs/InP/InGaAs/InP DHBTs with a novel composite–emmitter design"; 1999 IEEE; pp. 435–438.

* cited by examiner

*Primary Examiner*—Minhloan Tran
*Assistant Examiner*—Thomas L Dickey (57) ABSTRACT

A heterojunction for a semiconductor device. The heterojunction has a first region formed from a first semiconductor material having a first conductivity type, a second region formed from a second semiconductor material having a second conductivity type, and an intermediate layer between the first region and the second region. The band line-up of the first region, the intermediate layer, and the second region has no bound states in its conduction band and no bound states in its valence band. The intermediate layer has a thickness small enough to allow electrons to tunnel from the first region to the second region with negligible attenuation. The semiconductor device may be a heterojunction bipolar transistor. The conduction band of the intermediate layer has a higher energy level than the conduction bands of the first and second regions.

30 Claims, 5 Drawing Sheets

HETEROJUNCTION SEMICONDUCTOR DEVICE HAVING AN INTERMEDIATE LAYER FOR PROVIDING AN IMPROVED JUNCTION

TECHNICAL FIELD

Embodiments of the present invention relate to the field of semiconductor devices. Specifically, embodiments of the present invention relate to a heterojunction semiconductor device having an intermediate layer for improving a junction.

BACKGROUND ART

Heterojunction bipolar transistors (HBTs) have become state of the art, particularly in npn form, for applications in which high switching speeds and high frequency operation are desired. The emitter in an HBT has a bandgap wider than the bandgap of the base, thus creating an energy barrier in the valence band at the emitter-base junction that inhibits the unwanted flow of holes from the base region to the emitter region. This arrangement increases the emitter injection efficiency, current gain, and operating frequency of the HBT.

First generation commercial HBTs were based on a gallium-arsenide (GaAs) substrate and semiconductor materials lattice matched to GaAs. Next generation HBTs are likely to be based on an indium-phosphide (InP) substrate and semiconductor materials lattice matched to InP. Typically, the base of such an HBT is fabricated from either the indium-gallium-arsenide (InGaAs) material system or the gallium-arsenide-antimonide (GaAsSb) material system, with the collector and the emitter fabricated from, for example, InP or InGaAs.

Heterojunction bipolar transistors (HBTs) with a GaAsSb base region and an InP emitter region have been grown epitaxially using metalorganic vapor phase epitaxy (MOVPE) for many years. It has been known that the performance of HBTs is greatly affected by the quality of the junction between the GaAsSb base region and the InP emitter region. Achieving the high quality junction between the GaAsSb base region and the InP emitter region is a challenging task since the elemental species of both group III and V atoms changes at the junction between the two regions.

A conventional way of improving the junction quality is optimizing the gas-switching sequence and utilizing growth pauses between gas switching. However, this approach involves time-consuming investigation of numerous gas-switching sequences resulting from all possible combinations of five different constituent atoms at the junction and variable growth-pause times that can be placed at the growth stops. Furthermore, the gas-switching sequence optimized in one MOVPE reactor cannot be easily transferred to another MOVPE reactor unless the reactors have a nearly identical reactor hardware design. This is because a reactor's hardware design has a direct influence on the complex gas-flow dynamics within an MOVPE reactor, which in turn dictates the gas-switching sequence.

As mentioned above, the performance of HBTs is greatly affected by the quality of the junction between the GaAsSb base region and the InP emitter region. Defects present in the junction negatively impact performance by causing recombination of charge carriers. Thus, unless very complex and time-consuming epitaxial growth steps are taken, the performance of the HBT will suffer.

Thus, one problem with conventional methods for forming a heterojunction in a semiconductor device is that it is difficult to form a junction with good properties without resorting to complex epitaxial growth steps. Moreover, another problem with conventional methods is that they are highly dependent on the hardware design of the MOVPE reactor. A still further problem is conventional HBTs suffer from excessive recombination of charge carriers.

DISCLOSURE OF THE INVENTION

The present invention pertains to a heterojunction for a semiconductor device. An embodiment provides a semiconductor junction comprising a first region formed from a first semiconductor material and having a first conductivity type, a second region formed from a second semiconductor material and having a second conductivity type, and an intermediate layer between the first region and the second region. The band line-up of the first region, the intermediate layer, and the second region has no bound states in its conduction band and no bound states in its valence band. In some embodiments, the intermediate layer has a thickness small enough to allow electrons to tunnel from the first region to the second region with negligible attenuation.

Another embodiment provides for a heterojunction bipolar transistor comprising a collector region and a base region forming a junction with the collector region. The transistor also comprises an emitter region and an intermediate layer between the base region and the emitter region. The intermediate layer has a higher conduction band energy level than the conduction band energy level of the emitter region. Furthermore, the intermediate layer is thin enough for electrons to tunnel from the emitter region to the base region with negligible attenuation.

Another embodiment provides for a method for forming a heterojunction. The method includes forming a first region comprising a first semiconductor material having a first conductivity type. The method further includes forming an intermediate layer proximate the first region. The method also includes forming a second region proximate the intermediate layer and comprising a second semiconductor material having a second conductivity type, wherein there are no bound states formed in either the conduction or the valence band of the heterojunction.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

In the following detailed description of embodiments of the present invention, a heterojunction semiconductor device, numerous specific details are set forth in order to provide a thorough understanding of the present invention. However, the present invention may be practiced without these specific details or by using alternative elements or methods. In other instances well known methods, procedures, and components have not been described in detail as not to unnecessarily obscure aspects of embodiments of the present invention.

Various embodiments of the present invention provide for a heterojunction in a semiconductor device having good properties without resorting to complex epitaxial growth steps. Embodiments provide for, but are not limited to, a heterojunction bipolar transistor (HBT). Embodiments of the present invention provide a way to improve the quality of the junction between semiconductors of the heterojunction while not requiring time-consuming investigation of numerous gas-switching sequences. Moreover, embodiments of the present invention can be applied to any MOVPE reactor regardless of hardware design. Embodiments of the present invention provide an HBT with relatively little recombination of charge carriers. Thus, embodiments of the present invention provide for an improved base-emitter junction that leads to a higher current gain in HBTs than the current gain of conventional HBTs.

In one embodiment of the present invention, a heterojunction is greatly improved by inserting a thin, intermediate layer between a GaAsSb region and InP region. For example, the heterojunction may be a base-emitter heterojunction, the intermediate layer may be formed from InAlAs, the GaAsSb region may form a transistor base region, and the InP region may form a transistor emitter region. In one embodiment, the intermediate layer is 0.3–0.6 nanometers (nm) thick. The intermediate layer may be lattice-matched to the surrounding regions, although this is not required.

While described below using an npn heterojunction bipolar transistor (HBT), embodiments of the present invention are equally applicable to an HBT having a pnp configuration. Embodiments of the present invention are also applicable to other heterojunction semiconductor devices, such as optoelectronic devices.

Figure 1:
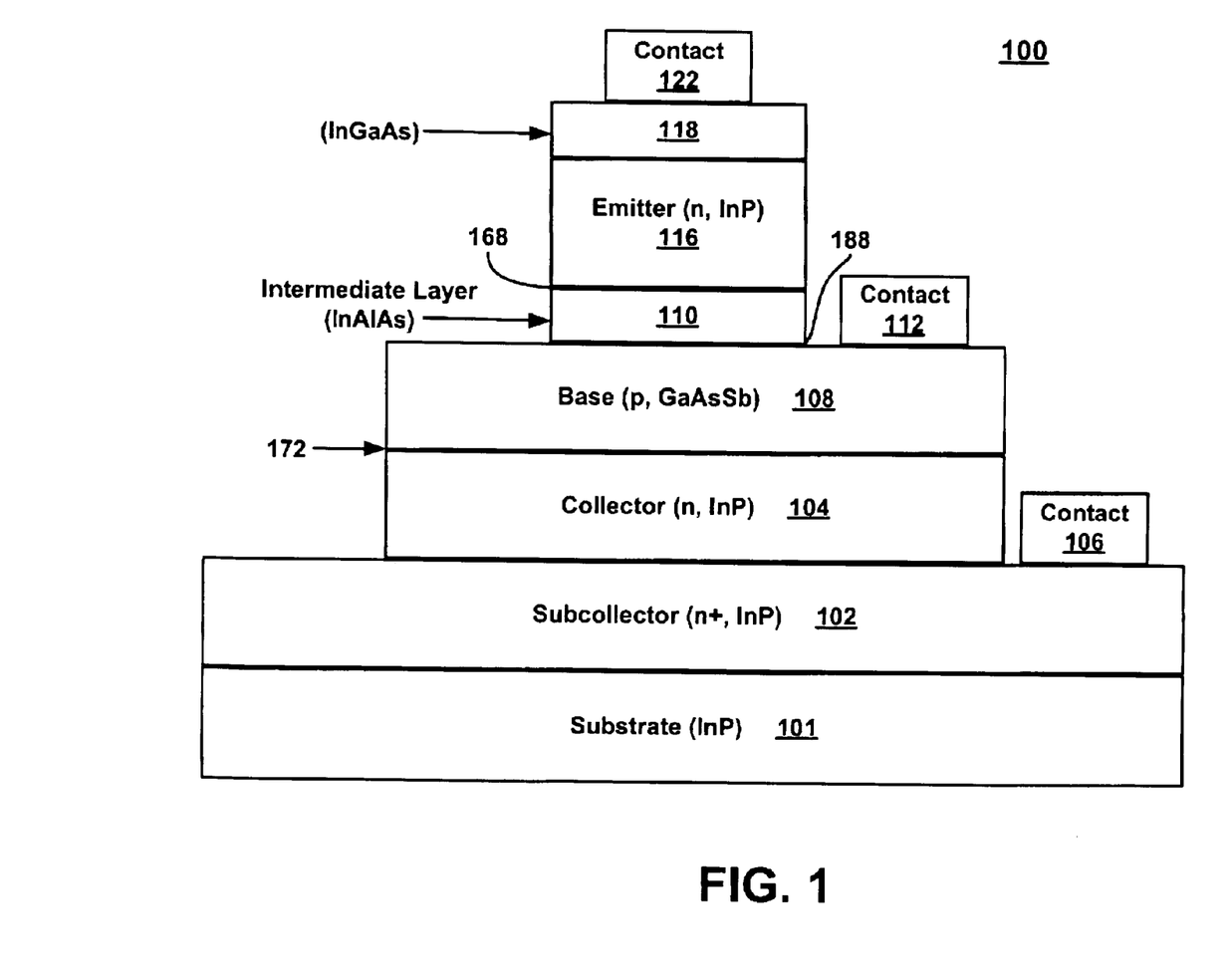
FIG. 1 is a cross-sectional view illustrating an HBT according to an embodiment of the present invention.

FIG. 1 is a cross-sectional view illustrating a simplified HBT 100 constructed in accordance with an embodiment of the present invention. The HBT 100 comprises an InP substrate 101 on which a heavily n-doped subcollector region 102 is grown. An n-doped InP collector region 104 is grown on the subcollector region 102. A metal contact 106 is applied on portions of the subcollector region 102, as shown. A heavily p-doped GaAsSb base region 108 is grown on the InP collector region 104 and a metal contact 112 is applied to portions of the GaAsSb base region 108, as shown. Between the InP collector region 104 and GaAsSb base region 108 is a GaAsSb/InP junction 172. In accordance with an aspect of one embodiment of the present invention, an intermediate layer 110 is grown on the GaAsSb base region 108, thus forming a GaAsSb/InAlAs junction 188 between the GaAsSb base region 108 and intermediate layer 110. In the present embodiment, the background carrier conductivity for the InAlAs intermediate layer 110 is n-type and the InAlAs intermediate layer 110 is not intentionally doped. However, the background carrier conductivity is not required to be n-type. Moreover, the InAlAs intermediate layer 110 can be lightly doped, either p-type or n-type. In this event, the InAlAs intermediate layer 110 should be completely depleted under normal bias conditions.

An emitter region 116 comprising a lightly n-doped InP region is grown on the InAlAs intermediate layer 110, thus forming an InAlAs/InP junction 168. A heavier n-doped InGaAs region 118 is grown on the InP region. This InGaAs layer 118 provides an ohmic contact to the emitter region 116 to allow metal contact 122 to be applied on the emitter region 116.

The intermediate layer 110 has a thickness small enough to allow electrons to tunnel from the emitter region 116 to the base region 108 with negligible attenuation. For example, if the InAlAs intermediate layer 110 is approximately 0.3–0.6 nanometers in thickness, then most electrons that are incident upon it from the emitter region 116 should tunnel through. In this case, an estimate of the tunneling probability is 0.5 to 0.7. As long as the tunneling probability is not very small, its main effect will be to decrease the peak current that can be driven through the emitter-base junction. For typical emitter doping of $5 \times 10^{17}/cm^3$, the tunneling probability will not be the primary factor that limits the operating current density unless it is well below 0.1. At a given operating current density, the electron concentration in the GaAsSb base region 108 is fixed, essentially independent of emitter design. Consequently, the InAlAs intermediate layer 110 causes little change to the overlap between electron and hole wavefunctions at the emitter-base junction.

The intermediate layer 110 may be grown of a material whose bulk lattice constant matches the lattice constant of the underlying region or grown pseudomorphically of a material whose bulk lattice constant does not match the lattice constant of the underlying region.

In one embodiment of the present invention, the material of the intermediate layer 110 has a bulk lattice constant equal to the lattice constant of the GaAsSb base region 108 and the InP emitter region 116. In one embodiment, the intermediate layer 110 is grown using InAlAs. The lattice matching condition for the InAlAs intermediate layer 110 grown on InP is 52% In. In such an embodiment, the bulk lattice constant of the InAlAs of the intermediate layer 110 matches the lattice constant of the GaAsSb base material and the InP emitter material.

Alternatively, in another embodiment, the intermediate layer 110 is not made of a lattice-matched material, but is sufficiently thin and grown pseudomorphically so that its lattice constant conforms to the lattice constant of the GaAsSb base region 108 and the InP emitter region 116. When a thin intermediate layer is grown pseudomorphically it becomes "strained" so that its lattice constant conforms to the lattice constant of the substrate. As known in the art, the lattice constant in a pseudomorphic layer is stretched or compressed so that it matches the substrate lattice constant in the two dimensions perpendicular to the growth direction. Although the lattice constant in the growth direction will be completely different, the lattice constant presented by the pseudomorphic surface to incoming constituent atoms during growth is the same as a lattice-matched surface. Therefore, physically, the use of a thin pseudomorphic layer as the intermediate layer 110 is very similar to the use of a lattice-matched intermediate layer 110. Moreover, other layers, such as the GaAsSb base region 108 can be grown pseudomorphically.

For convenience of illustration, the following discussion will assume that the intermediate layer 110 is formed using InAlAs. However, it is possible that other materials having a bulk lattice constant that matches the lattice constant of the GaAsSb base material may be used to form the intermediate layer 110. Thus, embodiments of the present invention are not limited to using InAlAs for the intermediate layer 110.

In some embodiments, the intermediate layer 110 is formed from, for example, AlGaInAs. The lattice matching condition for the AlGaInAs layer grown on InP is approximately 52% In.

The subcollector region 102, collector region 104, base region 108, intermediate layer 110 and the emitter region 116 can be grown using, for example, but not limited to, molecular beam epitaxy (MBE) and metal-organic vapor-phase epitaxy (MOVPE).

The present embodiment improves current gain by improving the quality of the heterojunction by adding an intermediate layer 110, without significantly adding to carrier recombination compared with no added intermediate layer 110. Because the InAlAs/InP junction 168 is tenths of a nanometer away from the GaAsSb base region 108, the GaAsSb/InAlAs junction 188 is the most important junction determining the interface recombination velocity at the base-emitter heterojunction. It is expected that the contribution of spatially-indirect radiative recombination to the interface recombination velocity with the thin InAlAs intermediate layer 110 in place will be nearly the same as the contribution of spatially-indirect radiative recombination for a conventional GaAsSb/InP junction. Moreover, the GaAsSb/InAlAs junction 188 has been found to have a lower defect density than a conventional GaAsSb/InP base-emitter junction when the materials are grown by MOVPE, as is discussed in conjunction with FIG. 3 herein. Thus, current gain is improved. Even if the materials are grown by other than MOVPE, the GaAsSb/InAlAs junction 188 is expected to have a lower defect density than a conventional GaAsSb/InP junction. Thus, embodiments of the present invention are not limited to MOVPE growth.

Figure 2:
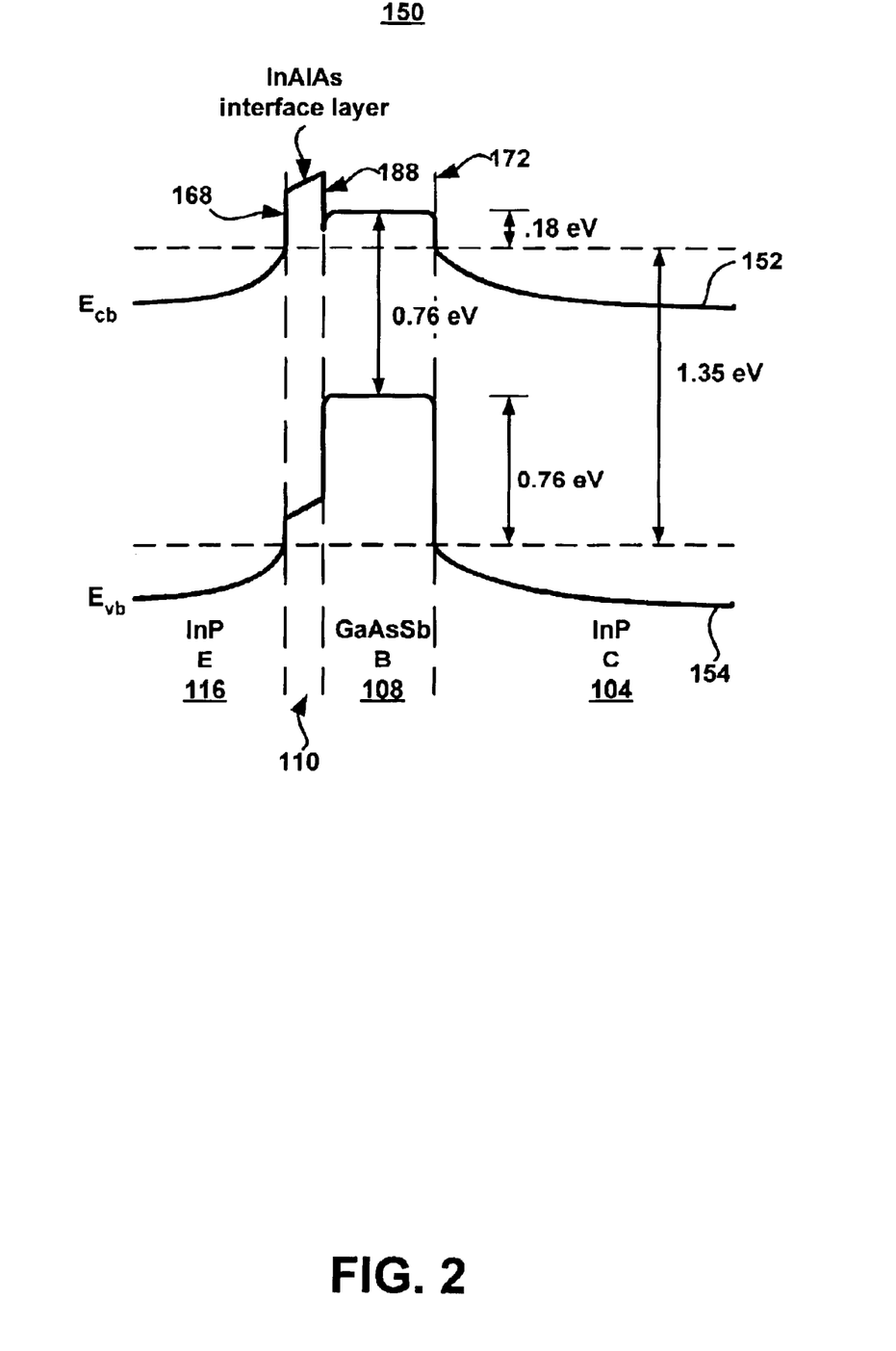
FIG. 2 is a graphical illustration showing an energy band diagram of the HBT shown in FIG. 2.

FIG. 2 is a graphical illustration showing an energy band diagram 150 of the HBT of FIG. 1. The illustration shows the conduction band energy levels 152 for InP emitter region 116, intermediate layer 110, GaAsSb base region 108, and InP collector region 104. The valance band energy levels 154 are also shown for the same regions. The GaAsSb/InP heterojunction 172 between the GaAsSb base region 108 and the InP collector region 104 provides a conduction band discontinuity $\Delta Ec$ of 0.18 eV and a valence band discontinuity $\Delta Ev$ of 0.76 eV.

A conventional heterojunction semiconductor has a heterojunction at the base-emitter junction. Even though embodiments of the present invention have an intermediate layer 110 between an emitter region and a base region, the term heterojunction will be used throughout this description to describe the region between the InP emitter region 116 and GaAsSb base region 108, including the intermediate layer 110. The term heterojunction will also be used to describe junctions such as the InP/InAlAs heterojunction 168 and the InAlAs/GaAsSb heterojunction 188.

The band line-up of the InAlAs intermediate layer 110 between the GaAsSb base region 108 and InP emitter region 116 is such that no bound states are formed in either the conduction band or the valence band. Furthermore, the InAlAs intermediate layer 110 is thin enough that the electrons from the emitter region 116 tunnel through the intermediate layer 110 with negligible attenuation. For example, the overlap between electron and hole wavefunctions at the GaAsSb/InAlAs heterojunction 188 is hardly changed relative to a heterojunction without an InAlAs intermediate layer 110. Thus, the combination of GaAsSb/InAlAs and InAlAs/InP heterojunctions 188, 168 is expected to have a greater current gain than a conventional GaAsSb/InP junction because the electron transmission for tunneling through the InAlAs is close to 1, and the non-radiative junction recombination is reduced because there are fewer grown-in defects. Moreover, the present invention is not limited to using InAlAs for the intermediate layer 110.

As illustrated in FIG. 2, the InAlAs intermediate layer 110 does not create a quantum well between the InP emitter region 116 and the GaAsSb base region 108 at either the conduction band 152 or the valence band 154. Thus, there is no quantum well to capture electrons in the intermediate layer 110 and contribute to undesirable emitter recombination current. Further, the conduction band 152 of the intermediate layer 110 has a higher energy level than the conduction band 152 of the emitter region 116. Also, the conduction band 152 of intermediate layer 110 has a higher energy level than the conduction band 152 of the base region 108.

Figure 3:
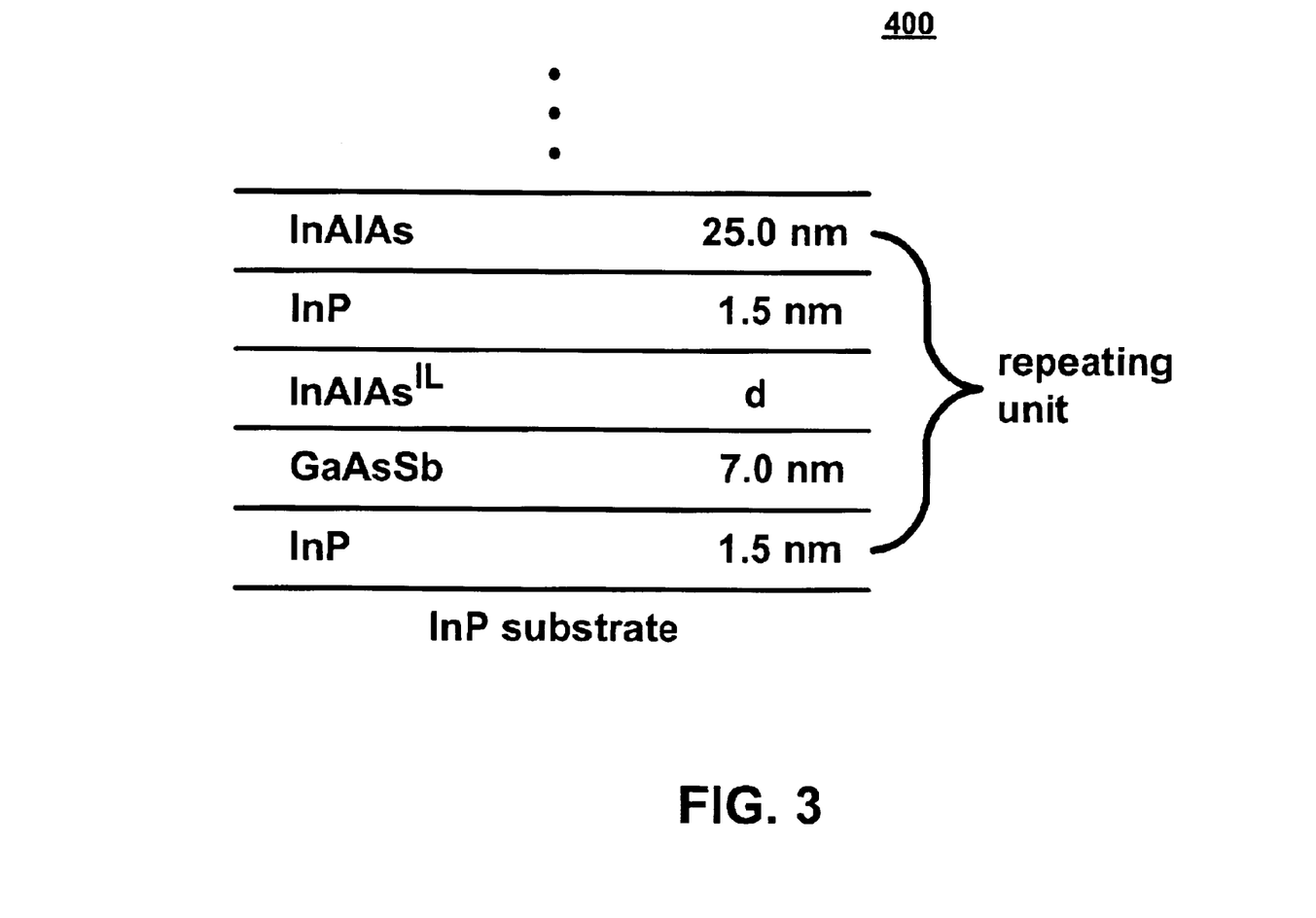
FIG. 3 is a schematic diagram of a superlattice grown on InP to determine suitable thicknesses for various embodiments of the present invention.

Referring now to FIG. 3, to demonstrate that inserting a thin InAlAs intermediate layer between the GaAsSb base region and the InP emitter region reduces the density of defects in the base-emitter junction and to determine suitable thicknesses of the InAlAs intermediate layer, specially designed superlattices shown in FIG. 3 were grown on InP substrates by MOVPE and characterized by room-temperature photoluminescence (PL) spectroscopy.

The superlattices 400 have a repeating unit of InP(1.5 nm)/GaAsSb(7 nm)/InAlAs$^{IL}$(d)/InP(1.5 nm)/InAlAs(25 nm). The InAlAs$^{IL}$ layer is designed to represent the intermediate layer (FIG. 1 and FIG. 2, 110). This unit is repeated seven times in the superlattices, in this example. These superlattices are designed to exhibit spatially-direct PL transition within GaAsSb quantum wells. Because the defects present at the junctions act as non-radiative recombination centers, the junction quality has a direct influence on the PL intensity.

Figure 4:
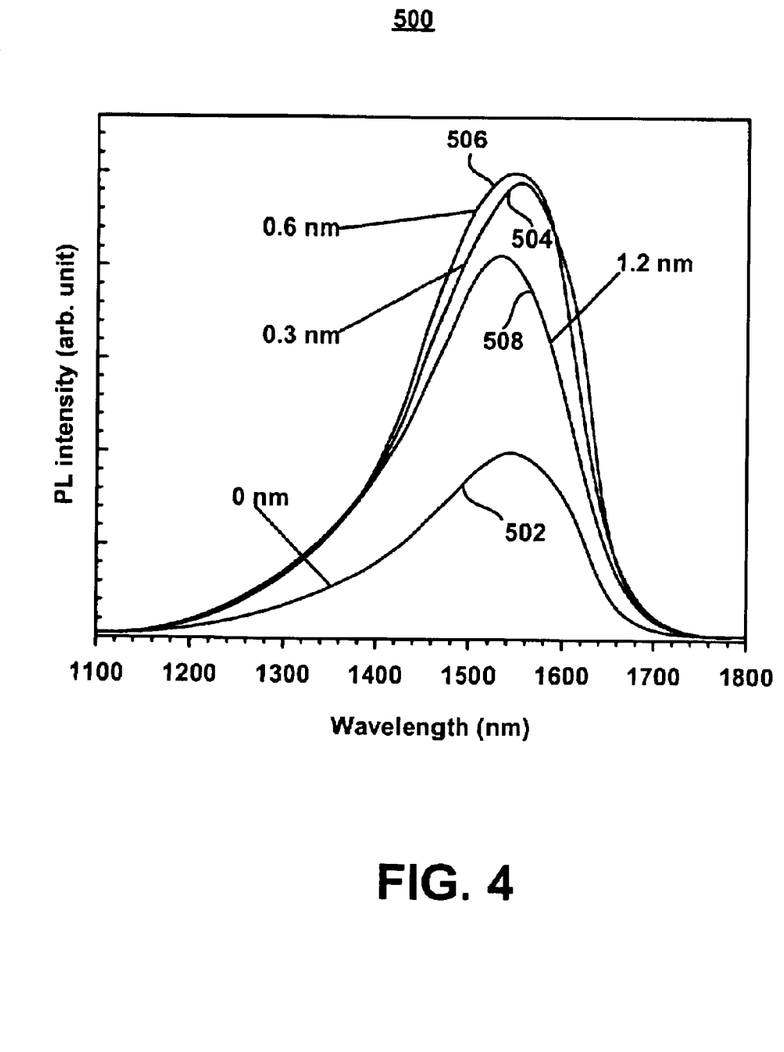
FIG. 4 is a graph of photoluminescence spectra for various thicknesses of the intermediate layer used in various embodiments of the present invention.

To determine a suitable range of thicknesses of the InAlAs intermediate layer, PL intensities of the superlattices with InAlAs$^{IL}$ layer thickness in the range of 0 to 1.2 nm were investigated. The thickness of the other layers was kept constant. Thus, any change in PL intensity is due to the thickness of the intermediate layer. FIG. 4 shows room-temperature PL spectra of superlattices with differing InAlAs$^{IL}$ layer thickness. The graph 500 shows PL intensity on the y-axis in arbitrary units versus wavelength in nanometers on the x-axis. The superlattice without the InAlAs intermediate layer shows the weakest PL intensity, as seen by the 0 nm thickness curve 502. A 0.3–0.6 nm thick InAlAs intermediate layer greatly increases the PL intensity, by a factor of 2.5, indicating that inserting a thin InAlAs intermediate layer improves the heterojunction quality and the combination of GaAsSb/InAlAs and InAlAs/InP junctions is better than a conventional GaAsSb/InP junction. This is shown by the 0.3 nm and 0.6 nm thickness curves 504 and 506. A thicker (e.g., 1.2 nm) InAlAs intermediate layer was found to be less effective in improving the junction quality than a 0.3–0.6 nm thick InAlAs intermediate layer, as evidenced by weaker PL intensity of the 1.2 nm thickness curve 508.

A desirable range of intermediate layer thickness depends upon factors such as the materials used and the epitaxial growth process. Thus, the results from FIG. 4 are exemplary. While the growth process may affect the optimum thickness, embodiments of the present invention are suitable for a wide variety of growth processes. Too thick an InAlAs intermediate layer is empirically observed to be detrimental, in this example. In addition, an InAlAs intermediate layer that is too thick will decrease the tunneling of electrons through the layer, which is detrimental to the HBT's performance because it reduces the collector current at a given emitter bias voltage.

Figure 5:
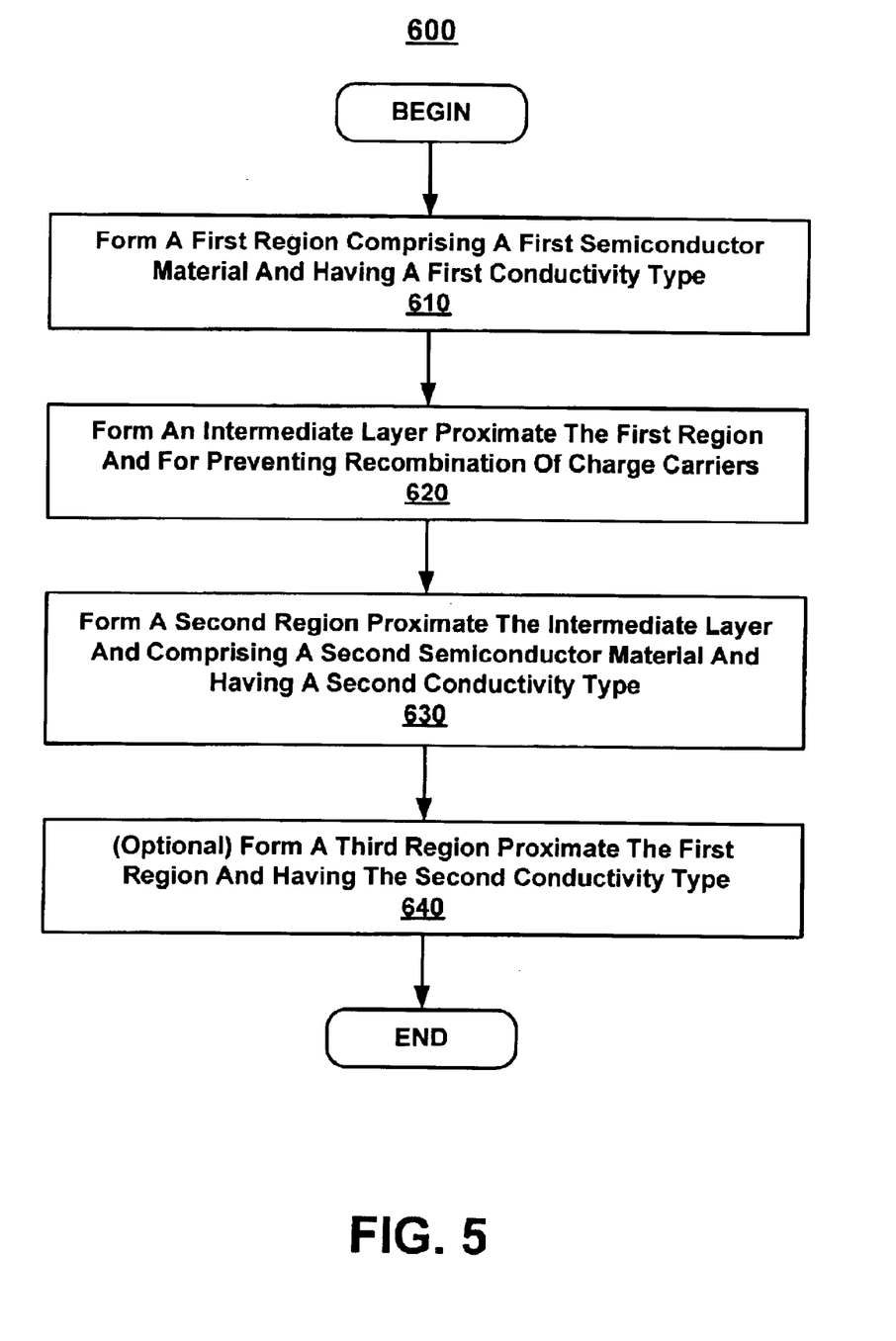
FIG. 5 is a flowchart illustrating a process of forming a heterojunction semiconductor device, according to an embodiment of the present invention.

Referring now to FIG. 5, an embodiment of the present invention is a method of forming a heterojunction semiconductor device. Such a heterojunction may be used in, but is not limited to, a heterojunction bipolar transistor. Block 610 of process 600 is the formation of a first region from a first semiconductor material and having a first conductivity type. The conductivity may be n-type or p-type.

Block 620 is the formation of an intermediate layer proximate the first region. The intermediate layer serves to prevent the recombination of charge carriers. The intermediate layer is formed of a material having a higher conduction band energy than the conduction band energies of the materials of the first and second regions. The thickness of this layer depends upon the material selected and other factors. In various embodiments, the thickness of the intermediate layer is less than approximately 1.2 nm, in the range of between approximately 0.3 to 0.6 nm, and less than approximately 0.6 nm.

Block 630 is the formation of a second region proximate the intermediate layer and formed from a second semiconductor material and having a second conductivity type. Thus, the first and second regions effectively form a heterojunction having an intermediate layer between the first and second regions. The intermediate layer is extremely thin, wherein electrons from the second region tunnel through to the first region with negligible attenuation.

Advantageously, blocks 610–630 may result in the formation of a heterojunction having no bound states in either a conduction or a valence band.

In optional block 640, a third region is formed proximate the first region. The third region has the second conductivity type. Thus, either a pnp or npn transistor is formed. The third region may form a heterojunction with the first region, although this is not required.

While the present invention has been described in particular embodiments, it should be appreciated that the present invention should not be construed as limited by such embodiments, but rather construed according to the below claims.

We claim:

1. A semiconductor heterojunction, comprising:
   a first region comprising InP and having a first conductivity type;
   a second region comprising GaAsSb and having a second conductivity type; and
   an intermediate layer between said first region and said second region and comprising InAlAs;
   wherein the band line-up of said first region, said intermediate layer, and said second region has no bound states in the conduction band and no bound states in the valence band.

2. The semiconductor heterojunction of claim 1, wherein: the conduction band of said intermediate layer has a higher energy level than the conduction band of said first region.

3. The semiconductor heterojunction of claim 2, wherein: said conduction band of said intermediate layer has a higher energy level than the conduction band of said second region.

4. The semiconductor heterojunction of claim 1, wherein: said intermediate layer has a thickness small enough to allow electrons to tunnel from said first region to said second region with negligible attenuation.

5. The semiconductor heterojunction of claim 1, wherein said intermediate layer is lattice-matched to said second region.

6. The semiconductor heterojunction of claim 5, wherein said intermediate layer is lattice-matched to said first region.

7. The semiconductor heterojunction of claim 1, wherein said intermediate layer is not lattice-matched to said first and second regions.

8. The semiconductor heterojunction of claim 1, wherein said intermediate layer is less than approximately 1.2 nanometers in thickness.

9. The semiconductor heterojunction of claim 1, wherein said intermediate layer is less than approximately 0.6 nanometers in thickness.

10. The semiconductor heterojunction of claim 1, wherein said currently amended layer is in the range of between approximately 0.3 to 0.6 nanometers in thickness.

11. The semiconductor heterojunction of claim 1, wherein said first region is p-doped and said second region is n-doped.

12. A heterojunction bipolar transistor comprising:
    a collector region;
    a base region forming a junction with said collector region and comprising GaAsSb;
    an emitter region comprising InP; and
    an intermediate layer between said base region and said emitter region, said intermediate layer comprising AlGaInAs;
    wherein the conduction band of said intermediate layer has a higher energy level than the conduction band of said emitter region and wherein said intermediate layer has a thickness small enough to allow electrons to tunnel from said emitter region to said base region with negligible attenuation.

13. The transistor of claim 12, wherein the conduction band of said intermediate layer has a higher energy level than the conduction band of said base region.

14. The transistor of claim 12, wherein said intermediate layer does not create a quantum well at the valance band of said intermediate layer relative to the valence bands of said emitter region and said base region.

15. The transistor of claim 12, wherein the band line-up has no bound states in the conduction band between said emitter region and said base region.

16. The transistor of claim 15, wherein the band line-up has no bound states in the valence band between said emitter region and said base region.

17. The transistor of claim 12, wherein the band line-up has no bound states in the valence band between said emitter region and said base region.

18. The transistor of claim 12, wherein said emitter region, said base region, and said collector region form an npn configuration.

19. The transistor of claim 12, wherein said intermediate layer is less than approximately 1.2 nanometers in thickness.

20. The transistor of claim 12, wherein said intermediate layer is in the range of between approximately 0.3 to 0.6 nanometers in thickness.

21. A method for forming a heterojunction, said method comprising:
    a) forming a first region comprising a first semiconductor material having a first conductivity type;
    b) forming an intermediate layer proximate said first region; and c) forming a second region proximate said intermediate layer and comprising a second semiconductor material having a second conductivity type, wherein there are no bound states formed in either the conduction band or the valence band between said first region and said second region, and wherein said intermediate layer comprises a material having a lower energy level valence band than a material forming the first region and a higher energy level valence band than a material forming the second region, wherein said b) comprises forming said intermediate layer with a material having a higher energy level conduction band than the conduction bands of said first and second regions.

22. The method of claim 21, wherein said intermediate layer is formed with a thickness that allows electrons to tunnel from said second region to said first region with negligible attenuation.

23. The method of claim 21, wherein said intermediate layer is less than approximately 1.2 nanometers in thickness.

24. The method of claim 21, wherein said intermediate layer is in the range of between approximately 0.3 to 0.6 nanometers in thickness.

25. The method of claim 21, wherein said intermediate layer comprises InAlAs, said second region comprises InP, and said first region comprises GaAsSb.

26. The method of claim 21, further comprising forming a third region proximate said first region and having said second conductivity type, wherein a heterojunction bipolar transistor is formed.

27. A semiconductor heterojunction comprising:
a first region comprising a first semiconductor material and having a first conductivity type;
a second region comprising a second semiconductor material and having a second conductivity type; and
an intermediate layer between said first region and said second region, wherein said intermediate layer is less than approximately 0.6 nanometers in thickness;
wherein the band line-up of said first region, said intermediate layer, and said second region has no bound states in the conduction band and no bound states in the valence band.

28. The semiconductor heterojunction of claim 27, wherein:
the conduction band of said intermediate layer has a higher energy level than the conduction band of said first region.

29. The semiconductor heterojunction of claim 28, wherein:
the conduction band of said intermediate layer has a higher energy level than the conduction band of said second region.

30. The semiconductor heterojunction of claim 24, wherein said intermediate layer is in the range of between approximately 0.3 to 0.6 nanometers in thickness.

* * * * *